United States Patent
Bang et al.

(10) Patent No.: US 12,260,930 B2
(45) Date of Patent: Mar. 25, 2025

(54) MEMORY CORE CHARACTERISTIC SCREENING METHOD AND SYSTEM THEREOF

(71) Applicant: Integrated Silicon Solution Inc., Milpitas, CA (US)

(72) Inventors: Jeong Ho Bang, Milpitas, CA (US); Hyeon Jae Lee, Milpitas, CA (US); Wol Jin Lee, Milpitas, CA (US); Ki Hyung Ryoo, Milpitas, CA (US); Kwang Rae Cho, Milpitas, CA (US); Sun Byeong Yoon, Milpitas, CA (US)

(73) Assignee: INTEGRATED SILICON SOLUTION INC., Milpitas, CA (US)

( * ) Notice: Subject to any disclaimer, the term of this patent is extended or adjusted under 35 U.S.C. 154(b) by 174 days.

(21) Appl. No.: 18/145,927

(22) Filed: Dec. 23, 2022

(65) Prior Publication Data

US 2024/0212728 A1    Jun. 27, 2024

(51) Int. Cl.
| | |
|---|---|
| *G11C 7/00* | (2006.01) |
| *G11C 7/10* | (2006.01) |
| *G11C 7/12* | (2006.01) |
| *G11C 8/18* | (2006.01) |

(52) U.S. Cl.
CPC ............ *G11C 7/109* (2013.01); *G11C 7/1087* (2013.01); *G11C 7/12* (2013.01); *G11C 8/18* (2013.01)

(58) Field of Classification Search
CPC ......... G11C 7/109; G11C 7/1087; G11C 7/12; G11C 8/18
USPC ........................................................ 365/191
See application file for complete search history.

(56) References Cited

U.S. PATENT DOCUMENTS

| | | | | |
|---|---|---|---|---|
| 6,889,334 | B1 * | 5/2005 | Magro | H04L 7/0037 365/194 |
| 8,817,555 | B2 * | 8/2014 | Ok | G11C 7/109 365/194 |
| 9,564,213 | B2 * | 2/2017 | Sun | G11C 11/5642 |
| 10,431,292 | B2 * | 10/2019 | King | G06F 13/376 |
| 10,515,675 | B2 * | 12/2019 | Jo | G11C 11/4093 |
| 10,957,414 | B1 * | 3/2021 | Ahn | G11C 29/12005 |
| 11,037,608 | B2 * | 6/2021 | Park | H01L 25/0657 |
| 11,100,968 | B2 * | 8/2021 | Lee | G11C 29/44 |

(Continued)

FOREIGN PATENT DOCUMENTS

| | | | | |
|---|---|---|---|---|
| CN | 112420091 | A * | 2/2021 | G11C 5/025 |
| CN | 112420091 | B * | 2/2024 | G11C 5/025 |

*Primary Examiner* — Viet Q Nguyen
(74) *Attorney, Agent, or Firm* — McClure, Qualey & Rodack, LLP

(57) ABSTRACT

A memory core characteristic screening method includes the following steps. A command signal transmitting step includes configuring a processing module to transmit a command signal to a memory device. A first internal operating step includes configuring the memory device to operate a first operation to one of a word line, a bit line pair and a column line after a first strobe signal delay time according to a first command. A second internal operating step includes configuring the memory device to operate a second operation to another one of the word line, the bit line pair and the column line after a second strobe signal delay time according to a second command. A memory core characteristic screening step includes screening a memory core characteristic by shorting a timing between the first strobe signal delay time and the second strobe signal delay time.

20 Claims, 16 Drawing Sheets

(56) References Cited

U.S. PATENT DOCUMENTS

| | | | |
|---|---|---|---|
| 11,132,307 B2* | 9/2021 | Ware | G06F 13/1689 |
| 11,513,725 B2* | 11/2022 | Park | G06F 3/0604 |
| 11,721,408 B2* | 8/2023 | Kim | G06F 11/1068 |
| | | | 714/719 |
| 12,026,397 B2* | 7/2024 | Park | G06F 3/0604 |

* cited by examiner

MEMORY CORE CHARACTERISTIC SCREENING METHOD AND SYSTEM THEREOF

BACKGROUND

Technical Field

The present disclosure relates to memory systems. More particularly, the present disclosure relates to a memory core characteristic screening method and a system thereof.

Description of Related Art

Memory core characteristics in a memory device are not easy to monitor or screen, especially at low-frequency test environment. Due to tester clock limitation, it is not easy to screen the memory core characteristics as well at high-frequency test environment. However, the memory core characteristics for activating to write/read are usually hidden in memory internal operation. The memory timings are related with the memory core characteristics, such as the cell capacitor retention performance, the internal charge sharing timing margin, the bit line sense amplifier ability, the write driver ability and the pre-charge performance.

In view of this, there is currently a lack of a method or a system on the market that can find the memory devices with poor characteristics by using the memory timings, so the relevant industry is looking for its solution.

SUMMARY

According to one aspect of the present disclosure, a memory core characteristic screening method includes performing a command signal transmitting step, a first internal operating step, a second internal operating step and a memory core characteristic screening step. The command signal transmitting step is performed to configure a processing module to transmit a command signal to a memory device. The command signal includes a first command and a second command. The first internal operating step includes configuring the memory device to operate a first operation to one of a word line, a bit line pair and a column line after a first strobe signal delay time according to the first command. The second internal operating step includes configuring the memory device to operate a second operation to another one or the one of the word line, the bit line pair and the column line after a second strobe signal delay time according to the second command. The memory core characteristic screening step includes configuring the processing module to screen a memory core characteristic by shorting a timing between the first strobe signal delay time and the second strobe signal delay time. The first command and the second command are different from each other and applied on different elements in the memory device. The processing module includes one of a memory controller and a tester.

According to another aspect of the present disclosure, a memory core characteristic screening system includes a memory device and a processing module. The memory device includes a memory cell array. The memory cell array includes a plurality of memory cells coupled to a plurality of word lines, a plurality of bit line pairs and a plurality of column lines. The processing module accesses the memory device and transmits a command signal to the memory device, and the command signal includes a first command and a second command. The memory device operates a first operation to one of the word lines, the bit line pairs and the column lines after a first strobe signal delay time according to the first command, and operates a second operation to another one or the one of the word lines, the bit line pairs and the column lines after a second strobe signal delay time according to the second command. The processing module screens a memory core characteristic by shorting a timing between the first strobe signal delay time and the second strobe signal delay time.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below.

However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
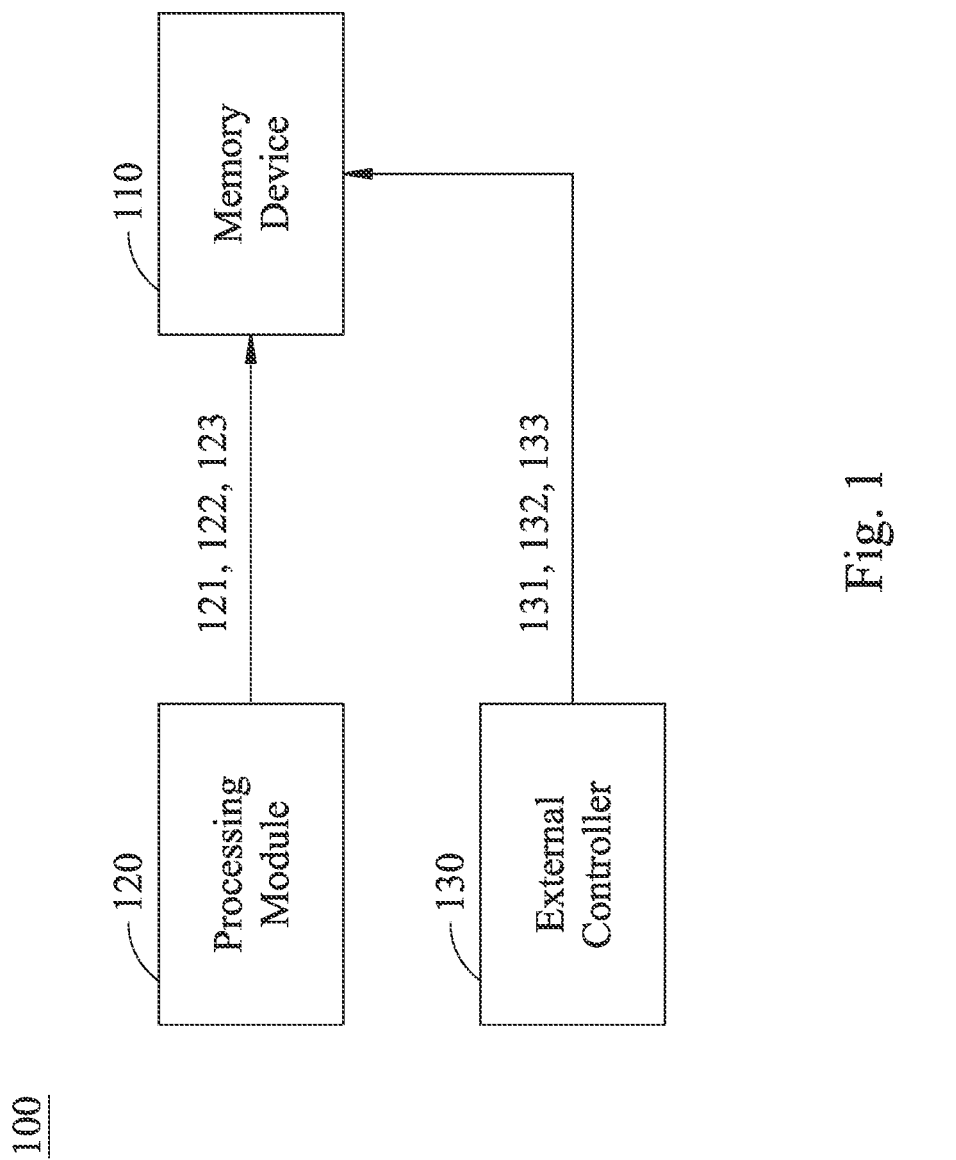
FIG. 1 shows a block diagram of a memory core characteristic screening system according to a first embodiment of the present disclosure.
Figure 2:
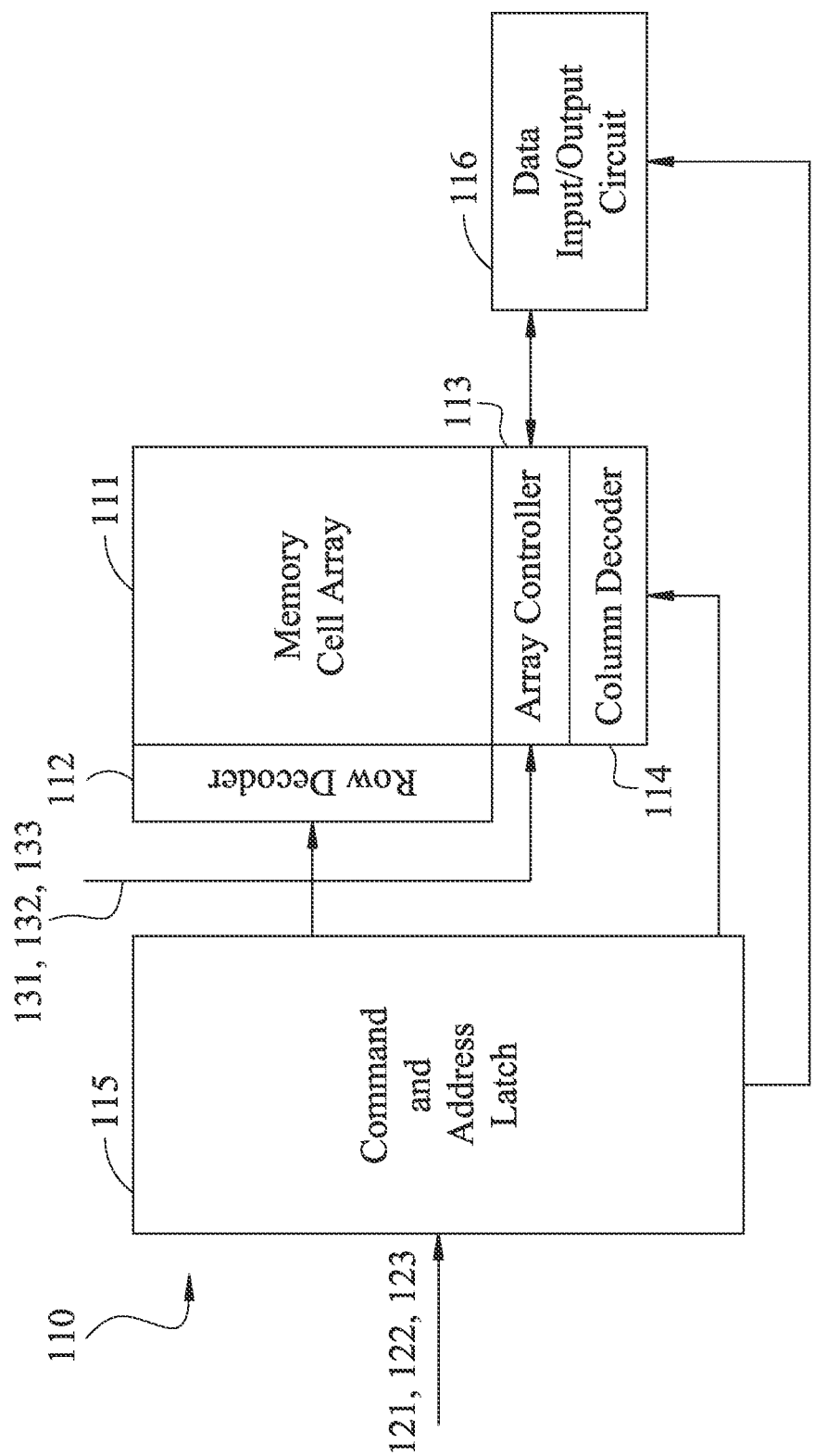
FIG. 2 shows a block diagram of a memory device of the memory core characteristic screening system of FIG. 1.

Please refer to FIGS. 1 and 2. FIG. 1 shows a block diagram of a memory core characteristic screening system 100 according to a first embodiment of the present disclosure. FIG. 2 shows a block diagram of a memory device 110 of the memory core characteristic screening system 100 of FIG. 1. The memory core characteristic screening system 100 includes the memory device 110, a processing module 120 and an external controller 130. The memory device 110 includes a memory cell array 111, a row decoder 112, an array controller 113, a column decoder 114, a command and address latch 115 and a data input/output circuit 116. The memory cell array 111 includes a plurality of memory cells coupled to a plurality of word lines, a plurality of bit line pairs and a plurality of column lines; in other words, the memory cell array 111 is a data storage area in which the memory cells are arranged in a row direction and a column direction. The row decoder 112 is configured to decode a command output from the command and address latch 115 to designate one of the word lines connected to one of the memory cells to or from which data will be input or output. The array controller 113 can be a sense amplifier, which is configured to sense and amplify data in the memory cells and store data in the memory cells. The column decoder 114 is configured to decode another command output from the command and address latch 115 to designate one of the column lines connected to one of the memory cells to or from which data will be input or output. The command and address latch 115 is configured to receive a plurality of command signals 121, 122, 123 output from the processing module 120 and convert each of the command signals 121, 122, 123 into the aforementioned commands. The data input/output circuit 116 is configured to write data into the memory cell array 111 according to on an address signal, and output data read from the memory cell array 111 according to the address signal.

The processing module 120 accesses the memory device 110 and transmits one of the command signals 121, 122, 123 to the memory device 110, and each of the command signals 121, 122, 123 includes a first command and a second command. The memory device 110 operates a first operation to one of the word lines, the bit line pairs and the column lines after a first strobe signal delay time according to the first command, and operates a second operation to another one or the one of the word lines, the bit line pairs and the column lines after a second strobe signal delay time according to the second command. The processing module 120 screens a memory core characteristic by shorting a timing between the first strobe signal delay time and the second strobe signal delay time.

In detail, the aforementioned timing can be a memory internal timing in the memory device 110, such as a RAS to CAS delay time (tRCD), a write recovery time (tWR) or a row pre-charge time (tRP). The memory internal timing (i.e., tRCD, tWR or tRP) is related with a plurality of the memory core characteristics, which can be the cell capacitor retention performance, the internal charge sharing timing margin, the bit line sense amplifier ability, the write driver ability and the pre-charge performance. Therefore, the memory core characteristic screening system 100 of the present disclosure can find the memory core characteristics with poor performance in the memory device 110 by shorting/changing the memory internal timing. Moreover, the memory core characteristic screening system 100 of the present disclosure can perform the verification and the failure analysis on the memory device 110 by monitoring the memory core characteristics, so that the fault coverage at the low-frequency can be enhanced. The external controller 130 is signally connected to the memory device 110 and transmits a plurality of external command signals 131, 132, 133 to the memory device 110. The operations of the external command signals 131, 132, 133 will be described later. In the first embodiment, the processing module 120 can include one of a memory controller and a tester, which is a command generator for generating the command signals 121, 122, 123, and the external controller 130 is a device independent from the processing module 120; in other embodiments, the external controller can belong to or be contained inside the processing module.

Figure 3:
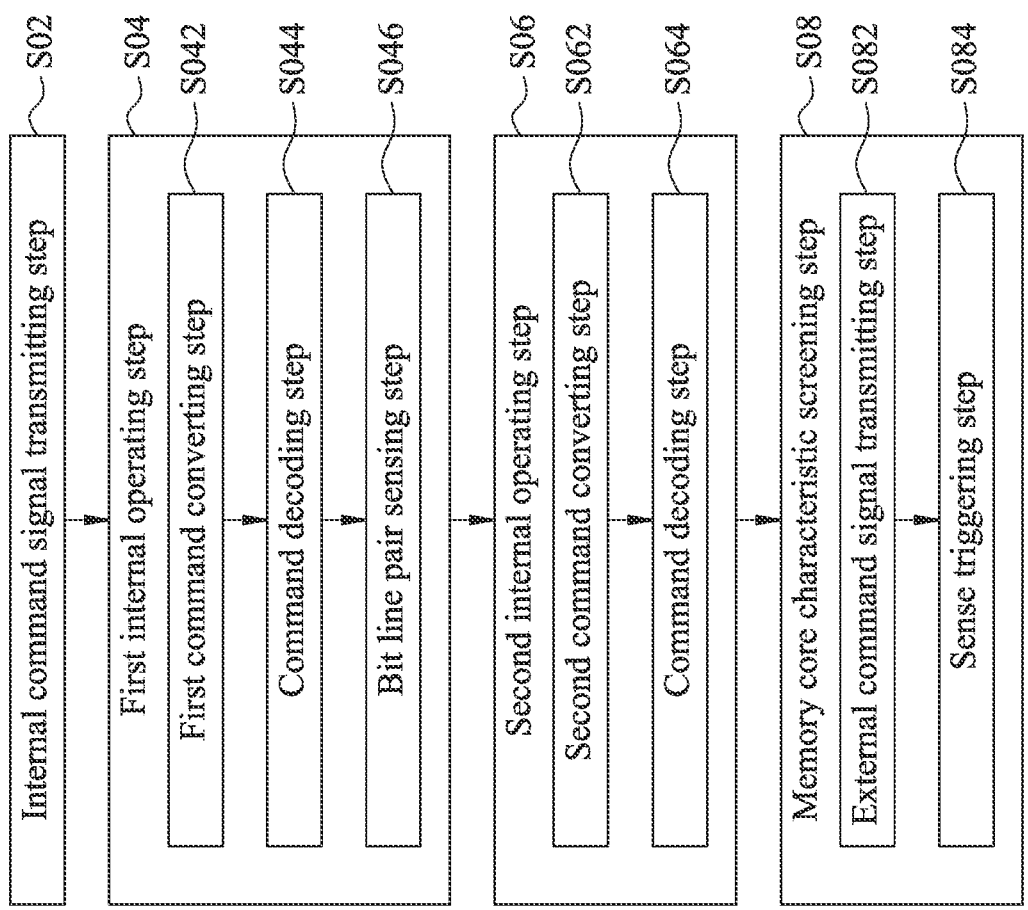
FIG. 3 shows a flow chart of a memory core characteristic screening method according to a second embodiment of the present disclosure.
Figure 4:
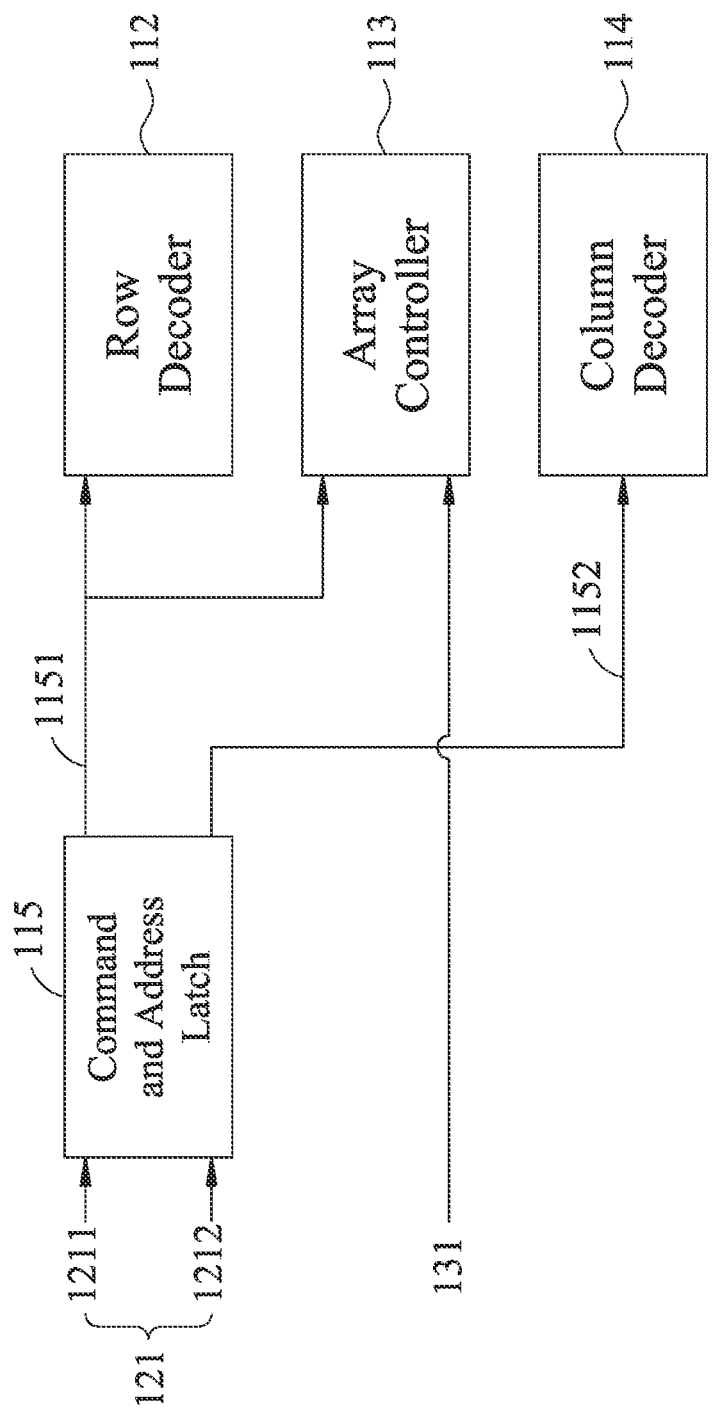
FIG. 4 shows a schematic view of the memory core characteristic screening method of FIG. 3 for screening a RAS to CAS delay time (tRCD).
Figure 5:
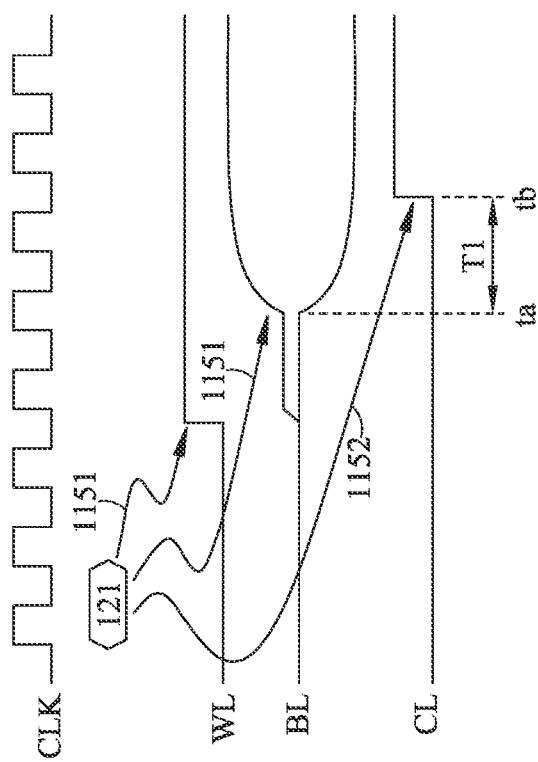
FIG. 5 shows a timing diagram of the memory core characteristic screening method of FIG. 3 for screening the tRCD by shorting a timing between a first strobe signal delay time and a second strobe signal delay time.
Figure 6:
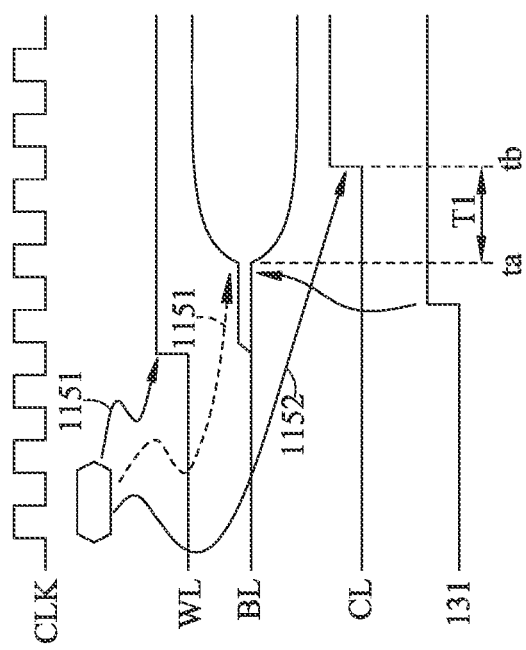
FIG. 6 shows a timing diagram of the memory core characteristic screening method of FIG. 3 for screening the tRCD via an external command signal.

Please refer to FIGS. 3, 4, 5 and 6. FIG. 3 shows a flow chart of a memory core characteristic screening method 200 according to a second embodiment of the present disclosure. FIG. 4 shows a schematic view of the memory core characteristic screening method 200 of FIG. 3 for screening the tRCD. FIG. 5 shows a timing diagram of the memory core characteristic screening method 200 of FIG. 3 for screening the tRCD by shorting a timing T1 between a first strobe signal delay time ta and a second strobe signal delay time tb. FIG. 6 shows a timing diagram of the memory core characteristic screening method 200 of FIG. 3 for screening the tRCD via the external command signal 131. As shown in FIG. 3, the memory core characteristic screening method 200 includes performing a command signal transmitting step S02, a first internal operating step S04, a second internal operating step S06 and a memory core characteristic screening step S08, and can be applied to the memory core characteristic screening system 100 of FIG. 1.

As shown in FIGS. 2, 4 and 5, the command signal transmitting step S02 is performed to configure the processing module 120 to transmit the command signal 121 to the memory device 110. The command signal 121 includes a first command 1211 and a second command 1212, and the first command 1211 and the second command 1212 are different from each other and applied on the row decoder 112 and the column decoder 114 in the memory device 110. Specifically, the command signal 121 can be a command sequence and synchronizes with a clock signal CLK of FIG. 5. In response to the command signal 121, a word line WL is activated.

The first internal operating step S04 includes configuring the memory device 110 to operate a first operation to a bit line pair BL after a first strobe signal delay time ta according to the first command 1211. The second internal operating step S06 includes configuring the memory device 110 to operate a second operation to a column line CL after a second strobe signal delay time tb according to the second command 1212. The memory core characteristic screening step S08 includes configuring the processing module 120 to screen a memory core characteristic by shorting the timing T1 between the first strobe signal delay time ta and the second strobe signal delay time tb. The timing T1 is the tRCD in the memory device 110, which is related with the memory core characteristic for the cell capacitor retention performance, the internal charge sharing timing margin, and the bit line sense amplifier ability.

Further, the first internal operating step S04 can further include performing a first command converting step S042, a command decoding step S044 and a bit line pair sensing step S046. The first command converting step S042 is performed to configure the command and address latch 115 of the memory device 110 to convert the first command 1211 into a row address strobe (RAS) command 1151 (as shown in FIG. 4). The command decoding step S044 is performed to configure the row decoder 112 of the memory device 110 to decode the RAS command 1151, and then activate the word line WL and perform charge sharing according to the RAS command 1151. The bit line pair sensing step S046 is performed to configure the array controller 113 of the memory device 110 to sense the bit line pair BL after the first strobe signal delay time ta according to the RAS command 1151. It is worth noting that, in the memory core characteristic screening step S08, the processing module 120 can delay the first strobe signal delay time ta to short the timing T1 between the first strobe signal delay time ta and the second strobe signal delay time tb so as to screen the memory core characteristic. In addition, the memory core characteristic screening system 100 can further include a delay circuit, which is composed by a transistor gate delay or a resistor/capacitor RC delay. A default delay amount for the first strobe signal delay time ta can be set to the medium value of the total delay. In the memory core characteristic screening step S08, the action of "delay the first strobe signal delay time ta" can be executed by providing a vendor specific command in a test mode. For example, if the tRCD in the test mode is set to "0", the strobe signal will be slow down or delayed through more delay circuits.

The second internal operating step S06 can further include performing a second command converting step S062 and a command decoding step S064. The second command converting step S062 is performed to configure the command and address latch 115 of the memory device 110 to convert the second command 1212 into a column address strobe (CAS) command 1152 (as shown in FIG. 4). The command decoding step S064 is performed to configure the column decoder 114 of the memory device 110 to decode the CAS command 1152, and then select the column line CL to read a plurality of data from the bit line pair BL after the second strobe signal delay time tb according to the CAS command 1152. In the memory core characteristic screening step S08, the processing module 120 can bring forward the second strobe signal delay time tb as well, to short the timing T1 between the first strobe signal delay time ta and the second strobe signal delay time tb so as to screen the memory core characteristic. In addition, a default delay amount for the second strobe signal delay time tb can be set to the medium value of the total delay. In the memory core characteristic screening step S08, the action of "bring forward the second strobe signal delay time tb" can be executed by providing another vendor specific command in the test mode. For example, if the tRCD in the test mode is set to "1", the strobe signal will be bring forward through less delay circuits.

Furthermore, the memory core characteristic screening step S08 can further include performing an external command signal transmitting step S082 and a sense triggering step S084. The external command signal transmitting step S082 is performed to configure the external controller 130 to transmit the external command signal 131 to the memory device 110. The sense triggering step S084 is performed to configure the array controller 113 triggered by the external command signal 131 instead of the first strobe signal delay time ta to sense the bit line pair BL (as shown in FIG. 6). Thus, the memory core characteristic screening method 200 of the present disclosure can use the external command signal 131 to trigger sensing the bit line pair BL, so that the timing T1 can be screened; in other words, the memory core characteristic of the tRCD is found.

Figure 7:
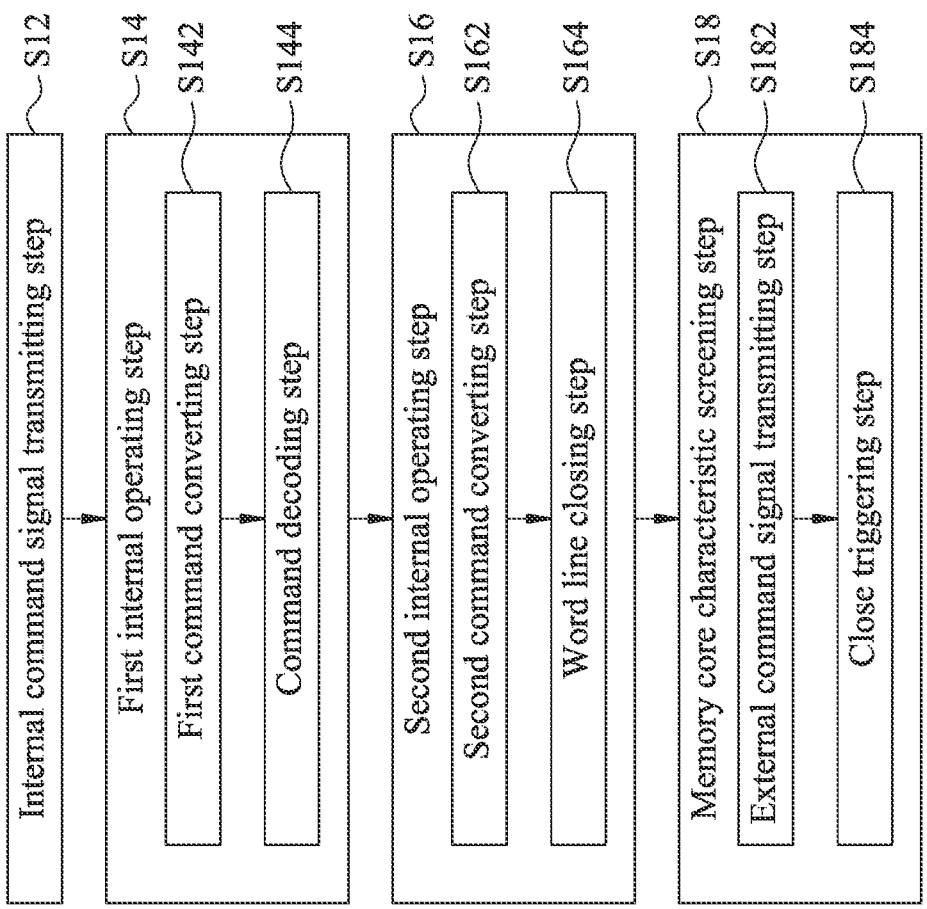
FIG. 7 shows a flow chart of a memory core characteristic screening method according to a third embodiment of the present disclosure.
Figure 8:
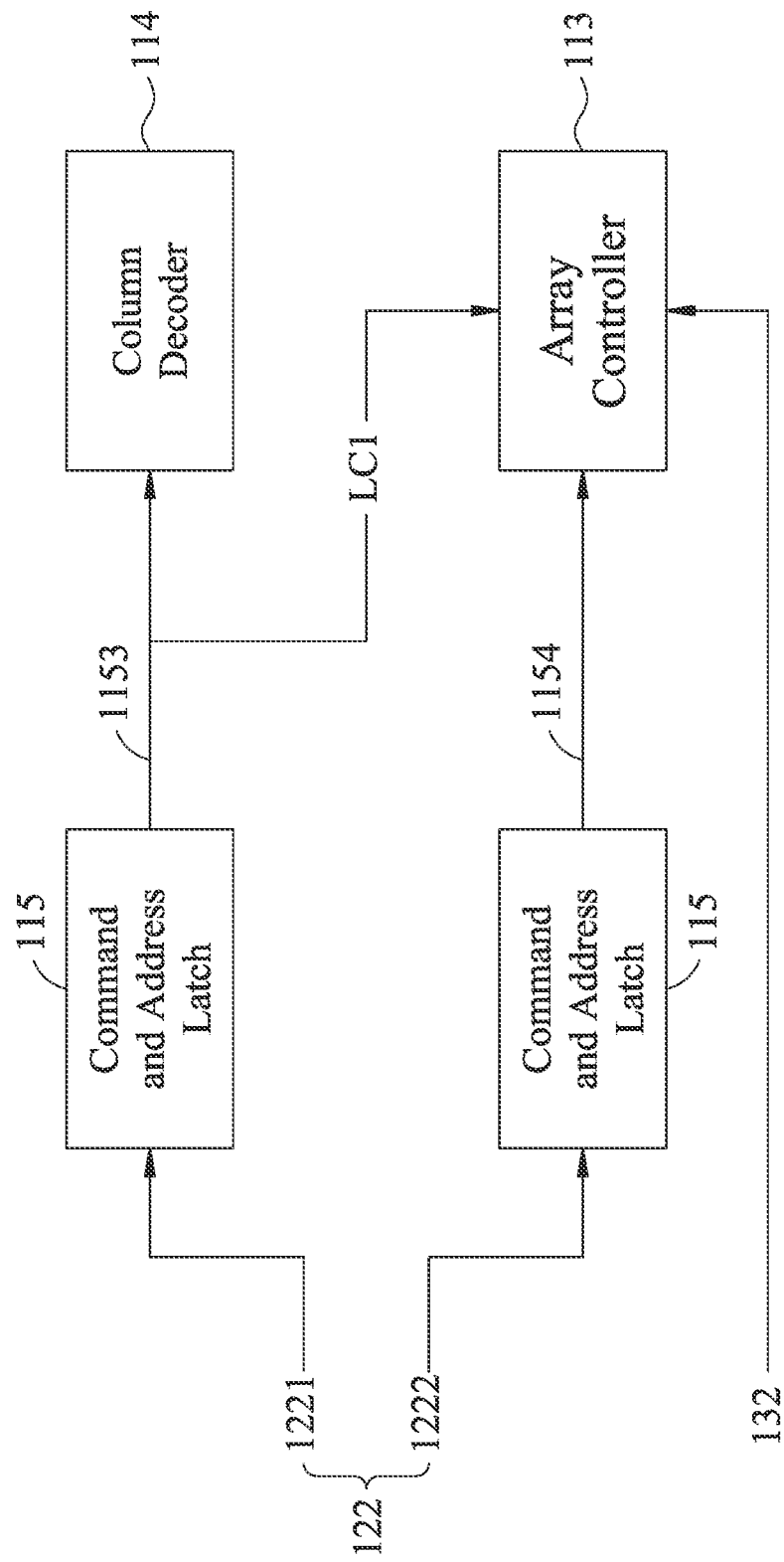
FIG. 8 shows a schematic view of the memory core characteristic screening method of FIG. 7 for screening a write recovery time (tWR).
Figure 9:
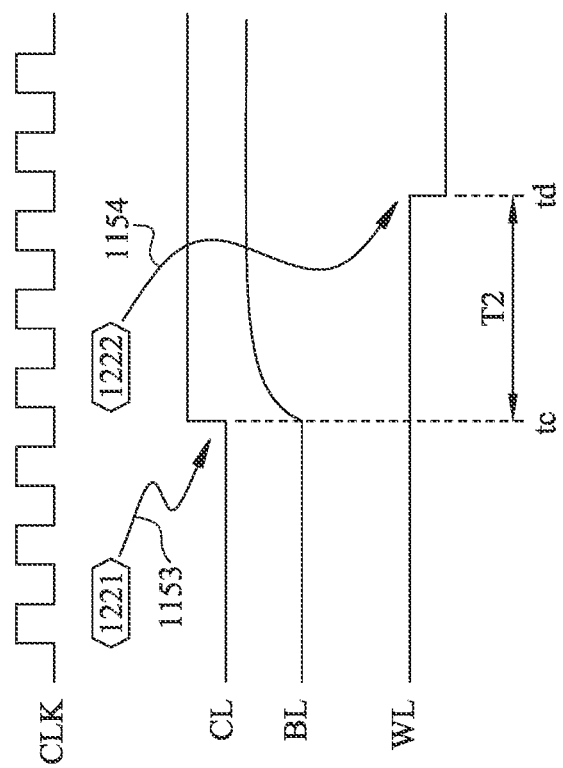
FIG. 9 shows a timing diagram of the memory core characteristic screening method of FIG. 7 for screening the tWR by shorting a timing between a first strobe signal delay time and a second strobe signal delay time.
Figure 10:
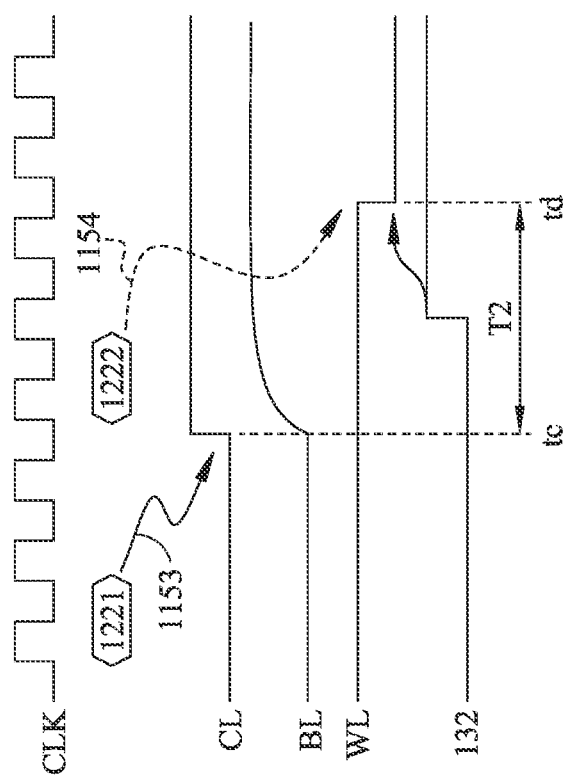
FIG. 10 shows a timing diagram of the memory core characteristic screening method of FIG. 7 for screening the tWR via an external command signal.
Figure 11:
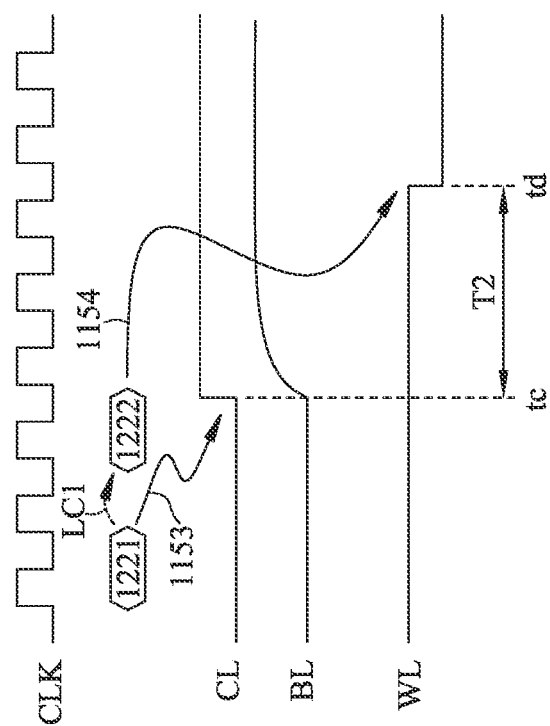
FIG. 11 shows a timing diagram of the memory core characteristic screening method of FIG. 7 for screening the tWR after a clock latency.

Please refer to FIGS. 7, 8, 9, 10 and 11. FIG. 7 shows a flow chart of a memory core characteristic screening method 300 according to a third embodiment of the present disclosure. FIG. 8 shows a schematic view of the memory core characteristic screening method 300 of FIG. 7 for screening a write recovery time (tWR). FIG. 9 shows a timing diagram of the memory core characteristic screening method 300 of FIG. 7 for screening the tWR by shorting a timing T2 between a first strobe signal delay time tc and a second strobe signal delay time td. FIG. 10 shows a timing diagram of the memory core characteristic screening method 300 of FIG. 7 for screening the tWR via the external command signal 132. FIG. 11 shows a timing diagram of the memory core characteristic screening method 300 of FIG. 7 for screening the tWR after a clock latency LC1. As shown in FIG. 7, the memory core characteristic screening method 300 can be applied to the memory core characteristic screening system 100 of FIG. 1, and includes performing a command signal transmitting step S12, a first internal operating step S14, a second internal operating step S16 and a memory core characteristic screening step S18.

As shown in FIGS. 2, 8 and 9, the command signal transmitting step S12 is performed to configure the processing module 120 to transmit a first command 1221 and the second command 1222 of the command signal 122 to the memory device 110. The first internal operating step S14 includes configuring the memory device 110 to operate a first operation to a column line CL after a first strobe signal delay time tc according to the first command 1221. The second internal operating step S16 includes configuring the memory device 110 to operate a second operation to a word line WL after a second strobe signal delay time td according to the second command 1222. The memory core characteristic screening step S18 includes configuring the processing module 120 to screen a memory core characteristic by shorting the timing T2 between the first strobe signal delay time tc and the second strobe signal delay time td. The timing T2 is the tWR in the memory device 110, which is related with the memory core characteristic for the cell capacitor retention performance, and the write driver ability.

Further, the first internal operating step S14 can further include performing a first command converting step S142 and a command decoding step S144. The first command converting step S142 is performed to configure the command and address latch 115 of the memory device 110 to convert the first command 1221 into a write command 1153. The command decoding step S144 is performed to configure the column decoder 114 of the memory device 110 to decode the write command 1153, and then select the column line CL to write a plurality of data into the bit line pair BL after the first strobe signal delay time tc. It is worth noting that, in the memory core characteristic screening step S18, the processing module 120 can delay the first strobe signal delay time tc to short the timing T2 between the first strobe signal delay time tc and the second strobe signal delay time td so as to screen the memory core characteristic.

The second internal operating step S16 can further include performing a second command converting step S162 and a word line closing step S164. The second command converting step S162 is performed to configure the command and address latch 115 of the memory device 110 to convert the second command 1222 into a pre-charge command 1154. The word line closing step S164 is performed to configure the array controller 113 of the memory device 110 to close the word line WL and pre-charge the bit line pair BL after the second strobe signal delay time td according to the pre-charge command 1154. In the memory core characteristic screening step S18, the processing module 120 can bring forward the second strobe signal delay time td to short the timing T2 between the first strobe signal delay time tc and the second strobe signal delay time td so as to screen the memory core characteristic.

Furthermore, the memory core characteristic screening step S18 can further include performing an external command signal transmitting step S182 and a close triggering step S184. The external command signal transmitting step S182 is performed to configure the external controller 130 to transmit the external command signal 132 to the memory device 110. The close triggering step S184 is performed to configure the array controller 113 triggered by the external command signal 132 instead of the second strobe signal delay time td to close the word line WL (as shown in FIG. 10). Thus, the memory core characteristic screening method 300 of the present disclosure can use the external command signal 132 to trigger closing the word line WL, so that the timing T2 can be screened; in other words, the memory core characteristic of the tWR is found. Moreover, in the memory core characteristic screening step S18, the array controller 113 can close the word line WL after the clock latency LC1 according to the write command 1153 as well (as shown in FIG. 11). In specific, when the array controller 113 receives the write command 1153, the word line WL will be closed by after the clock latency LC1. The clock latency LC1 can be at least one clock cycle, and the clock latency LC1 is preferably two clock cycles, so that the timing T2 can be screened too.

Figure 12:
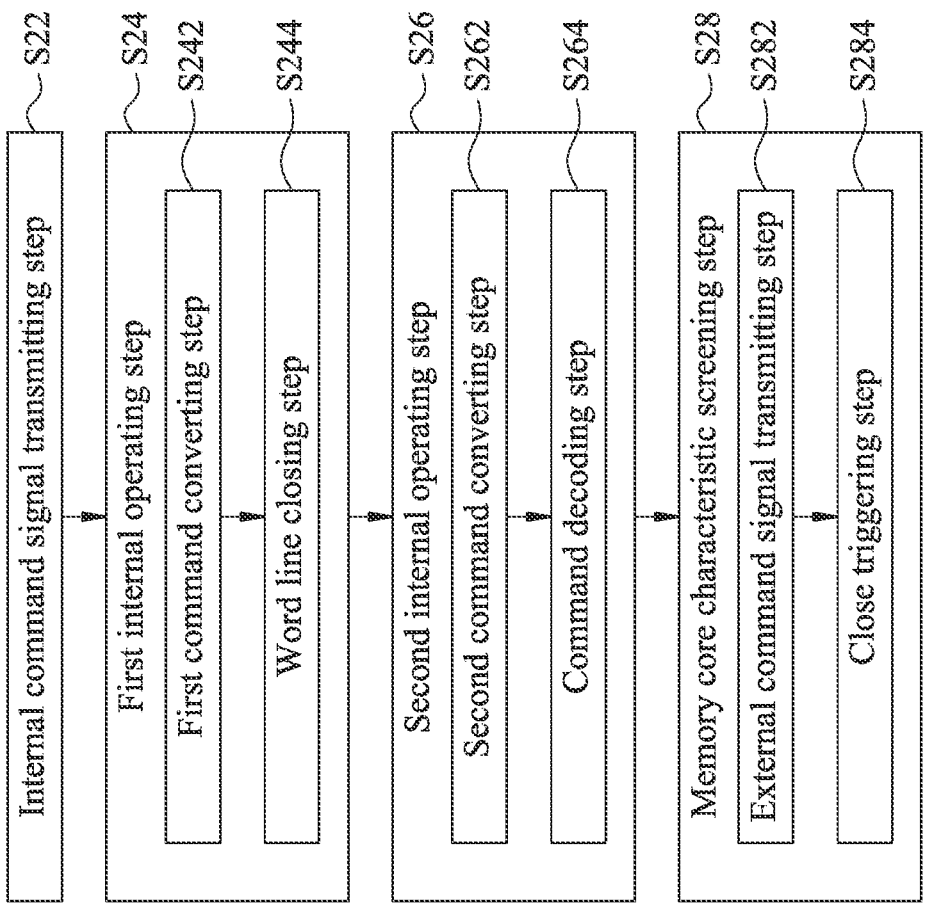
FIG. 12 shows a flow chart of a memory core characteristic screening method according to a fourth embodiment of the present disclosure.
Figure 13:
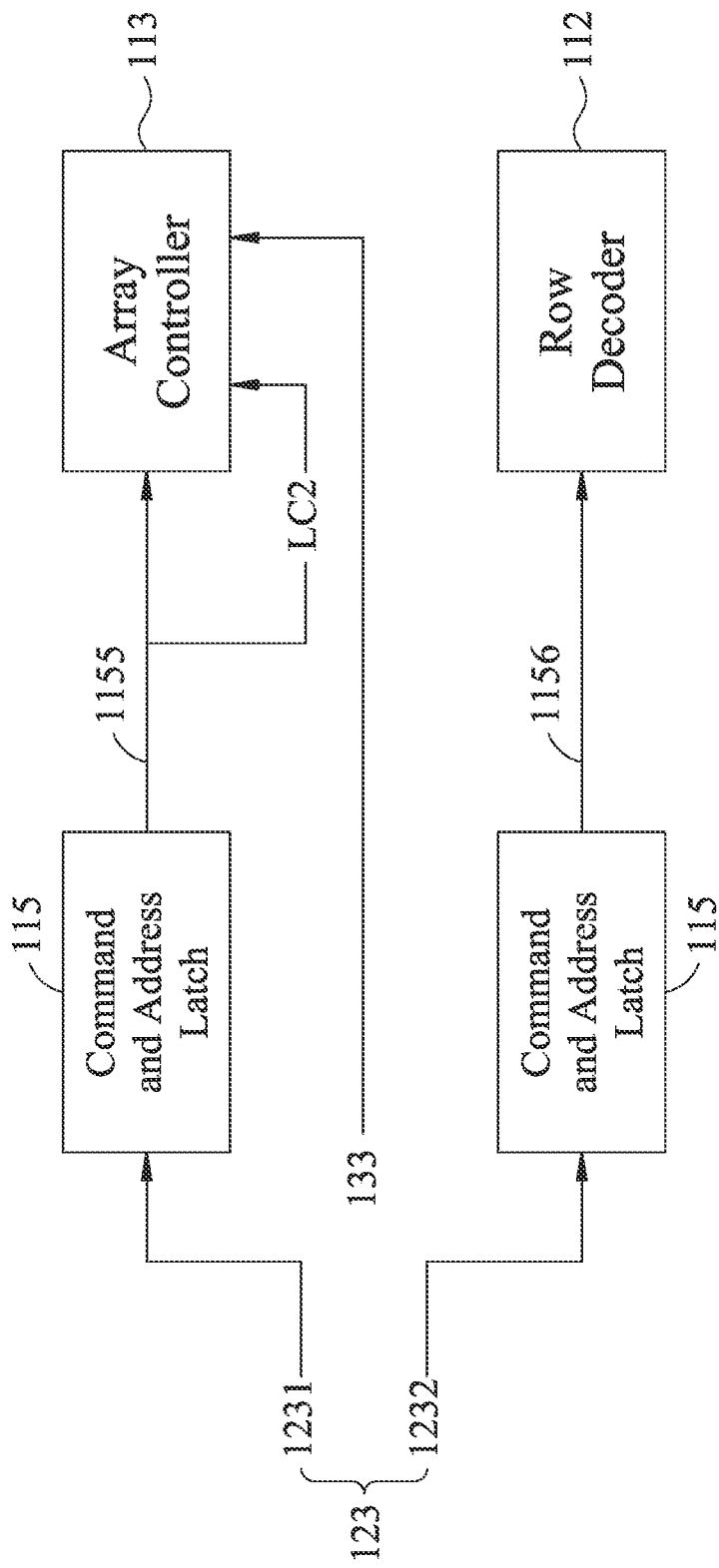
FIG. 13 shows a schematic view of the memory core characteristic screening method of FIG. 12 for screening a row pre-charge time (tRP).
Figure 14:
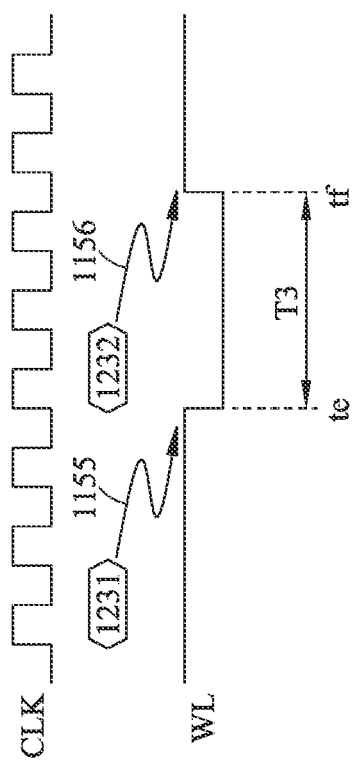
FIG. 14 shows a timing diagram of the memory core characteristic screening method of FIG. 12 for screening the tRP by shorting a timing between a first strobe signal delay time and a second strobe signal delay time.
Figure 15:
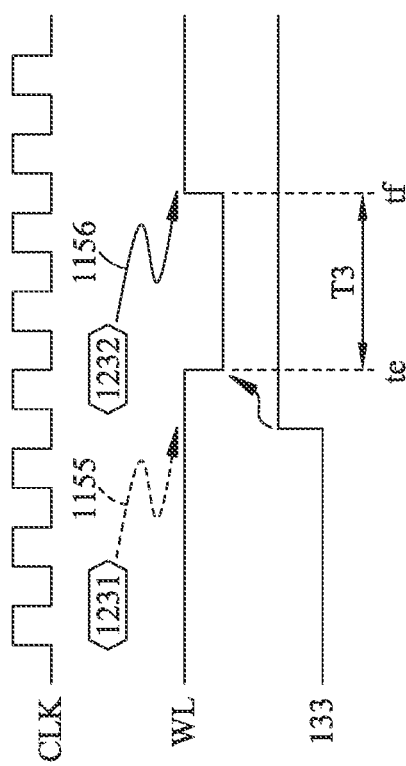
FIG. 15 shows a timing diagram of the memory core characteristic screening method of FIG. 12 for screening the tRP via an external command signal.
Figure 16:
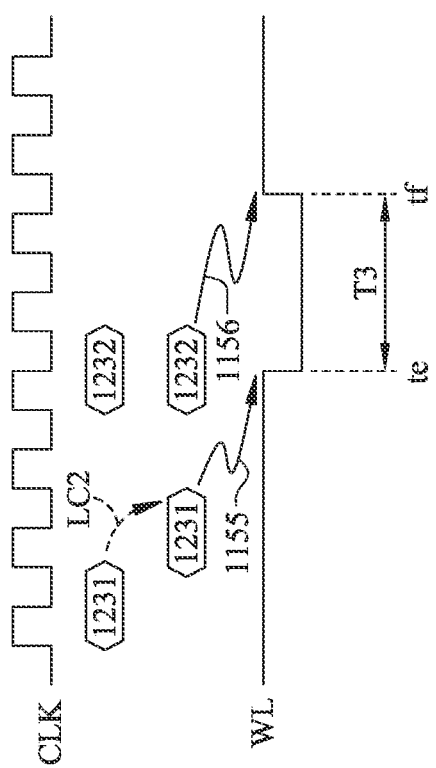
FIG. 16 shows a timing diagram of the memory core characteristic screening method of FIG. 12 for screening the tRP after a clock latency.

Please refer to FIGS. 12, 13, 14, 15 and 16. FIG. 12 shows a flow chart of a memory core characteristic screening method 400 according to a fourth embodiment of the present disclosure. FIG. 13 shows a schematic view of the memory core characteristic screening method 400 of FIG. 12 for screening a row pre-charge time (tRP). FIG. 14 shows a timing diagram of the memory core characteristic screening method 400 of FIG. 12 for screening the tRP by shorting a timing T3 between a first strobe signal delay time te and a second strobe signal delay time tf. FIG. 15 shows a timing diagram of the memory core characteristic screening method 400 of FIG. 12 for screening the tRP via an external command signal 133. FIG. 16 shows a timing diagram of the memory core characteristic screening method 400 of FIG. 12 for screening the tRP after a clock latency LC2. As shown in FIG. 12, the memory core characteristic screening method 700 can be applied to the memory core characteristic screening system 100 of FIG. 1, and includes performing a command signal transmitting step S22, a first internal operating step S24, a second internal operating step S26 and a memory core characteristic screening step S28.

As shown in FIGS. 2, 13 and 14, the command signal transmitting step S22 is performed to configure the processing module 120 to transmit a first command 1231 and a second command 1232 of the command signal 123 to the memory device 110. The first internal operating step S24 includes configuring the memory device 110 to operate a first operation to a word line WL after a first strobe signal delay time te according to the first command 1231. The second internal operating step S26 includes configuring the memory device 110 to operate a second operation to the word line WL after a second strobe signal delay time tf according to the second command 1232. The memory core characteristic screening step S28 includes configuring the processing module 120 to screen a memory core characteristic by shorting the timing T3 between the first strobe signal delay time te and the second strobe signal delay time tf. The timing T3 is the tRP in the memory device 110, which is related with the memory core characteristic for the pre-charge performance.

Further, the first internal operating step S24 can further include performing a first command converting step S242 and a word line closing step S244. The first command converting step S242 is performed to configure the command and address latch 115 of the memory device 110 to convert the first command 1231 into a pre-charge command 1155. The word line closing step S244 is performed to configure the array controller 113 of the memory device to close the word line WL and pre-charge the bit line pair after the first strobe signal delay time te according to the pre-charge command 1155. It is worth noting that, in the memory core characteristic screening step S28, the processing module 120 can delay the first strobe signal delay time te to short the timing T3 between the first strobe signal delay time te and the second strobe signal delay time tf so as to screen the memory core characteristic.

The second internal operating step S26 can further include performing a second command converting step S262 and a command decoding step S264. The second command converting step S262 is performed to configure the command and address latch 115 of the memory device 110 to convert the second command 1232 into an activate command 1156. The command decoding step S264 is performed to configure the row decoder 112 of the memory device 110 to decode the activate command 1156, and then activate the word line WL and perform a charge sharing after the second strobe signal delay time tf according to the activate command 1156.

Furthermore, the memory core characteristic screening step S28 can further include performing an external command signal transmitting step S282 and a close triggering step S284. The external command signal transmitting step S282 is performed to configure the external controller 130 to transmit the external command signal 133 to the memory device 110. The close triggering step S284 is performed to configure the array controller 113 triggered by the external command signal 133 instead of the first strobe signal delay time te to close the word line WL and pre-charge the bit line pair (as shown in FIG. 15). Thus, the memory core characteristic screening method 400 of the present disclosure can use the external command signal 133 to trigger closing the word line WL, so that the timing T3 can be screened; in other words, the memory core characteristic of the tRP is found. Moreover, in the memory core characteristic screening step S28, the array controller 113 can close the word line WL after the clock latency LC2 according to the pre-charge command 1155 as well (as shown in FIG. 16). In specific, when the array controller 113 receives the pre-charge command 1155, the word line WL will be closed by after the clock latency LC2. The clock latency LC2 can be at least one clock cycle, and the clock latency LC2 is preferably one clock cycle, so that the timing T3 can be screened too.

Therefore, the memory core characteristic screening methods 200, 300, 400 of the present disclosure can find the memory core characteristics with poor performance in the memory device 110 by shorting/changing the memory internal timings (i.e., the timings T1, T2, T3). Moreover, the memory core characteristic screening methods 200, 300, 400 of the present disclosure can perform the verification and the failure analysis on the memory device 110 by monitoring the memory core characteristics, so that the fault coverage at the low-frequency can be enhanced.

In summary, the present disclosure has the following advantages. First, finding the memory core characteristics with poor performance in the memory device by shorting/changing the memory internal timing. Second, only using single command signal for the verification and the failure analysis, thereby reducing the complexity of the verification and the failure analysis. Third, the fault coverage at the low-frequency can be enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory core characteristic screening method, comprising:
    performing a command signal transmitting step to configure a processing module to transmit a command signal to a memory device, wherein the command signal comprises a first command and a second command;
    performing a first internal operating step, wherein the first internal operating step comprises configuring the memory device to operate a first operation to a first one of a word line, a bit line pair and a column line after a first strobe signal delay time according to the first command;
    performing a second internal operating step, wherein the second internal operating step comprises configuring the memory device to operate a second operation to a second one of the word line, the bit line pair and the column line after a second strobe signal delay time according to the second command; and
    performing a memory core characteristic screening step, wherein the memory core characteristic screening step comprises configuring the processing module to screen a memory core characteristic by shorting a timing between the first strobe signal delay time and the second strobe signal delay time;
    wherein the first command and the second command are different from each other and applied on different elements in the memory device;
    wherein the processing module comprises one of a memory controller and a tester.

2. The memory core characteristic screening method of claim 1, wherein the first internal operating step further comprises:
    performing a first command converting step to configure a command and address latch of the memory device to convert the first command into a row address strobe (RAS) command;
    performing a command decoding step to configure a row decoder of the memory device to decode the RAS command, and then activate the word line according to the RAS command; and
    performing a bit line pair sensing step to configure an array controller of the memory device to sense the bit line pair after the first strobe signal delay time according to the RAS command.

3. The memory core characteristic screening method of claim 2, wherein in the memory core characteristic screening step, the processing module delays the first strobe signal delay time to short the timing between the first strobe signal delay time and the second strobe signal delay time.

4. The memory core characteristic screening method of claim 2, wherein the memory core characteristic screening step further comprises:
    performing an external command signal transmitting step to configure an external controller to transmit an external command signal to the memory device; and
    performing a sense triggering step to configure the array controller triggered by the external command signal instead of the first strobe signal delay time to sense the bit line pair.

5. The memory core characteristic screening method of claim 1, wherein the second internal operating step further comprises:
    performing a second command converting step to configure a command and address latch of the memory device to convert the second command into a column address strobe (CAS) command; and
    performing a command decoding step to configure a column decoder of the memory device to decode the CAS command, and then select the column line to read a plurality of data from the bit line pair after the second strobe signal delay time according to the CAS command.

6. The memory core characteristic screening method of claim 5, wherein in the memory core characteristic screening step, the processing module brings forward the second strobe signal delay time to short the timing between the first strobe signal delay time and the second strobe signal delay time.

7. The memory core characteristic screening method of claim 1, wherein the first internal operating step further comprises:
    performing a first command converting step to configure a command and address latch of the memory device to convert the first command into a write command; and
    performing a command decoding step to configure a column decoder of the memory device to decode the write command, and then select the column line to write a plurality of data into the bit line pair after the first strobe signal delay time.

8. The memory core characteristic screening method of claim 7, wherein in the memory core characteristic screening step, the processing module delays the first strobe signal delay time to short the timing between the first strobe signal delay time and the second strobe signal delay time.

9. The memory core characteristic screening method of claim 7, wherein in the memory core characteristic screening step, an array controller of the memory device closes the word line after a clock latency according to the write command.

10. The memory core characteristic screening method of claim 1, wherein the second internal operating step further comprises:
    performing a second command converting step to configure a command and address latch of the memory device to convert the second command into a pre-charge command; and
    performing a word line closing step to configure an array controller of the memory device to close the word line and pre-charge the bit line pair after the second strobe signal delay time according to the pre-charge command.

11. The memory core characteristic screening method of claim 10, wherein in the memory core characteristic screening step, the processing module brings forward the second strobe signal delay time to short the timing between the first strobe signal delay time and the second strobe signal delay time.

12. The memory core characteristic screening method of claim 10, wherein the memory core characteristic screening step further comprises:
    performing an external command signal transmitting step to configure an external controller to transmit an external command signal to the memory device; and
    performing a close triggering step to configure the array controller triggered by the external command signal instead of the second strobe signal delay time to close the word line.

13. The memory core characteristic screening method of claim 1, wherein the first internal operating step further comprises:
    performing a first command converting step to configure a command and address latch of the memory device to convert the first command into a pre-charge command; and
    performing a word line closing step to configure an array controller of the memory device to close the word line and pre-charge the bit line pair after the first strobe signal delay time according to the pre-charge command.

14. The memory core characteristic screening method of claim 13, wherein in the memory core characteristic screening step, the processing module delays the first strobe signal delay time to short the timing between the first strobe signal delay time and the second strobe signal delay time.

15. The memory core characteristic screening method of claim 13, wherein the memory core characteristic screening step further comprises:
    performing an external command signal transmitting step to configure an external controller to transmit an external command signal to the memory device; and
    performing a close triggering step to configure the array controller triggered by the external command signal instead of the first strobe signal delay time to close the word line.

16. The memory core characteristic screening method of claim 13, wherein in the memory core characteristic screening step, the array controller closes the word line after a clock latency according to the pre-charge command.

17. The memory core characteristic screening method of claim 1, wherein the second internal operating step further comprises:
    performing a second command converting step to configure a command and address latch of the memory device to convert the second command into an activate command; and
    performing a command decoding step to configure a row decoder of the memory device to decode the activate command, and then activate the word line after the second strobe signal delay time according to the activate command.

18. A memory core characteristic screening system, comprising:
    a memory device comprising a memory cell array, wherein the memory cell array comprises a plurality of memory cells coupled to a plurality of word lines, a plurality of bit line pairs and a plurality of column lines; and
    a processing module accessing the memory device and transmitting a command signal to the memory device, wherein the command signal comprises a first command and a second command;
    wherein the memory device operates a first operation to a first one of the word lines, the bit line pairs and the column lines after a first strobe signal delay time according to the first command, and operates a second operation to a second one of the word lines, the bit line pairs and the column lines after a second strobe signal delay time according to the second command;
    wherein the processing module screens a memory core characteristic by shorting a timing between the first strobe signal delay time and the second strobe signal delay time.

19. The memory core characteristic screening system of claim 18, wherein the processing module delays the first strobe signal delay time to short the timing between the first strobe signal delay time and the second strobe signal delay time.

20. The memory core characteristic screening system of claim 18, wherein the processing module brings forward the second strobe signal delay time to short the timing between the first strobe signal delay time and the second strobe signal delay time.

* * * * *